US007666693B2

(12) United States Patent
Song et al.

(10) Patent No.: US 7,666,693 B2
(45) Date of Patent: Feb. 23, 2010

(54) TOP-EMITTING NITRIDE-BASED LIGHT EMITTING DEVICE AND METHOD OF MANUFACTURING THE SAME

(75) Inventors: June-o Song, Gwangju-si (KR); Tae-yeon Seong, Gwangju-si (KR); Joon-seop Kwak, Gyeonggi-do (KR); Woong-ki Hong, Gwangju-si (KR)

(73) Assignees: Samsung Electronics Co., Ltd. (KR); Gwangju Institute of Science and Technology (KR)

( * ) Notice: Subject to any disclaimer, the term of this patent is extended or adjusted under 35 U.S.C. 154(b) by 0 days.

(21) Appl. No.: 12/180,312

(22) Filed: Jul. 25, 2008

(65) Prior Publication Data

US 2008/0299687 A1 Dec. 4, 2008

Related U.S. Application Data

(62) Division of application No. 11/011,154, filed on Dec. 15, 2004, now Pat. No. 7,417,264.

(30) Foreign Application Priority Data

Dec. 22, 2003 (KR) ...................... 10-2003-0094698
Nov. 2, 2004 (KR) ...................... 10-2004-0088166

(51) Int. Cl.
*H01L 21/00* (2006.01)

(52) U.S. Cl. ................................ 438/22; 257/E33.064

(58) Field of Classification Search .................. 438/22; 257/E33.064

See application file for complete search history.

(56) References Cited

U.S. PATENT DOCUMENTS 4,694,116 A 9/1987 Hayashi et al.
5,428,249 A 6/1995 Sawayama et al.
5,681,402 A 10/1997 Ichinose et al.
5,861,636 A * 1/1999 Dutta et al. .................. 257/91
5,990,500 A 11/1999 Okazaki
6,121,635 A 9/2000 Watanabe et al.
6,194,743 B1 * 2/2001 Kondoh et al. ................ 257/94

(Continued)

FOREIGN PATENT DOCUMENTS

EP 0 733 931 A2 9/1996
JP 62176173 A 8/1987
JP 60010788 A 1/1995
JP 07131070 A 5/1995
JP 9-281517 A 10/1997

OTHER PUBLICATIONS

Y.C. Lin et al., "Nitride-Based Light-Emitting Diodes With NI/ITO P-Type OHMIC Contacts", IEEE Photonics Technology Letters, vol. 14, No. 12, Dec. 2002, pp. 1668-1670.

Shyi-Ming Pan, "Enhanced Output Power of INGAN-GAN Light-Emitting Diodes With High-Transparency Nickel-Oxide-Indium-Tin-Oxide OHMIC Contacts", IEEE Photonices Technology Letters, vol. 15, No. 5, May 2003, pp. 646-648.

(Continued)

*Primary Examiner*—Charles D Garber
*Assistant Examiner*—Stanetta D Isaac
(74) *Attorney, Agent, or Firm*—Cantor Colburn, LLP

(57) ABSTRACT

Provided are a top-emitting N-based light emitting device and a method of manufacturing the same. The device includes a substrate, an n-type clad layer, an active layer, a p-type clad layer, and a multi ohmic contact layer, which are sequentially stacked. The multi ohmic contact layer includes one or more stacked structures, each including a modified metal layer and a transparent conductive thin film layer, which are repetitively stacked on the p-type clad layer. The modified metal layer is formed of an Ag-based material.

8 Claims, 4 Drawing Sheets

U.S. PATENT DOCUMENTS

| | | | | |
|---|---|---|---|---|
| 6,268,618 | B1 | 7/2001 | Miki et al. | |
| 6,287,947 | B1 | 9/2001 | Ludowise et al. | |
| 6,469,324 | B1 | 10/2002 | Wang | |
| 6,495,862 | B1 | 12/2002 | Okazaki et al. | |
| 6,567,209 | B2 | 5/2003 | Lipson et al. | |
| 6,596,134 | B2 | 7/2003 | Forrest et al. | |
| 6,597,110 | B1 | 7/2003 | Thompson et al. | |
| 6,642,549 | B2 * | 11/2003 | Chen et al. | 257/99 |
| 2002/0030197 | A1 * | 3/2002 | Sugawara et al. | 257/103 |
| 2002/0036286 | A1 * | 3/2002 | Ho et al. | 257/11 |
| 2002/0149025 | A1 | 10/2002 | Andriessen | |
| 2003/0132449 | A1 | 7/2003 | Hosono et al. | |
| 2007/0034891 | A1 | 2/2007 | Song | |
| 2007/0164275 | A1 | 7/2007 | Ishiguro | |

OTHER PUBLICATIONS

C.S. Chang et al., "INGAN/GAN Light-Emitting Diodes With ITO P-Contact Layers Prepared by RF Sputtering", Institute of Physics Publishing, Semiconductor Science and Technology, 18, 2003, pp. L21-L23.

European Search Report (in English) issued by the European Patent Office on Nov. 23, 2006 in corresponding European Patent Application No. 04 25 7783, Munich, DE.

Choi, K.H., et al., "ITO/Ag/ITO Multilayer Films for the Application of a Very Low Resistance Transparent Electrode", Thin Solid Films, Mar. 12, 1999m pp. 152-155, vol. 341, Nos. 1-2, Elsevier Science S.A., Lausanne, CH.

English machine translation of JP 07131070, Koyama, Takehisa, Courtesy of JPO.

* cited by examiner

TOP-EMITTING NITRIDE-BASED LIGHT EMITTING DEVICE AND METHOD OF MANUFACTURING THE SAME

Priority is claimed to Korean Patent Applications No. 2003-94698, filed on Dec. 22, 2003, and No. 2004-88166, filed on Nov. 2, 2004, in the Korean Intellectual Property Office, the disclosures of which are incorporated herein in their entirety by reference.

BACKGROUND OF THE INVENTION

1. Field of the Invention

The present invention relates to a top-emitting N-based light emitting device and a method of manufacturing the same, and more particularly, to a top-emitting N-based light emitting device, which has improved ohmic characteristic and luminous efficiency, and a method of manufacturing the same.

2. Description of the Related Art

Nowadays, a transparent conductive thin film layer is being widely used in the fields of displays and energy industries.

In the field of light emitting devices, much research into transparent conductive thin-film electrodes that enable smooth hole injection and highly efficient light emission has been conducted.

Transparent conductive oxides (TCOs) and transparent conductive nitride (TCN) are materials for forming transparent conductive thin film layers and have lately been laboriously studied.

TCOs are, for example, indium oxide ($In_2O_3$), tin oxide ($SnO_2$), zinc oxide (ZnO), and indium tin oxide (ITO). TCN is, for example, titanium nitride (TiN).

However, these TCOs or TCN have a high sheet resistance, a high reflectivity, and a small work function. Thus, it is difficult to apply only one of the TCOs and TCN to a p-type transparent electrode of a top-emitting GaN-based light emitting device.

More specifically, first, when a thin film is formed of one of the above-described TCOs or TCN using physical vapor deposition (PVD), an e-beam or heat evaporator, or sputtering, the thin film has a high sheet resistance of about 100 $\Omega/cm^2$. Such a high sheet resistance of the thin film is an obstacle to the horizontal (parallel to an interfacial surface between films) current spreading of a light emitting device and the efficient vertical hole injection. Accordingly, it is difficult to apply one of the above-described transparent conductive materials to highly luminous light emitting devices, which have large area and high capacity.

Second, the above-described transparent conductive materials have a high reflectivity with respect to light emitted from GaN-based light emitting diodes, thus degrading luminous efficiency.

Third, since transparent conductive materials including ITO and TiN have a relatively small work function, it is difficult to form an ohmic contact between the transparent conductive materials and p-type GaN.

Finally, if an electrode that is directly ohmic-contacted with GaN-based compound semiconductor is formed using TCO, during formation of a thin film for the electrode, $Ga_2O_3$, which is an insulating material, is generated on the surface of GaN due to a high oxidation activity of Ga. This precludes formation of a good ohmic-contact electrode.

Meanwhile, when a light emitting device, such as a light emitting diode (LED) or a laser diode (LD), is formed using GaN-based compound semiconductor, a structure in which an ohmic contact between semiconductor and an electrode is formed is necessarily required.

GaN-based light emitting devices can be categorized into top-emitting light emitting diodes (TLEDs) and flip-chip light emitting diodes (FCLEDs).

In the prevalent TLEDs, light is emitted through an ohmic contact layer that contacts a p-type clad layer. Also, in order to embody a highly luminous TLED, a current spreading layer as an excellent ohmic contact layer is essentially required to compensate for a high sheet resistance of a p-type clad layer having a low hole concentration. Since the current spreading layer has a low sheet resistance and a high transmittance, smooth hole injection and current spreading and efficient light emission are enabled.

A conventional TLED includes a Ni layer and an Au layer, which are sequentially stacked on a p-type clad layer.

As is known, if the Ni/Au layer is annealed in an $O_2$ atmosphere, a semi-transparent ohmic contact layer, which has an excellent specific contact resistance of about $10^{-3}$ to $10^{-4}$ $\Omega/cm^2$, is formed. When the semi-transparent ohmic contact layer is annealed in an $O_2$ atmosphere at a temperature of about 500 to 600□, the low specific contact resistance of the semi-transparent ohmic contact layer reduces Schottky barrier height (SBH) and thus, facilitates supply of carriers, i.e., holes, to the vicinity of the surface of the p-type clad layer.

Also, if the Ni/Au layer formed on the p-type clad layer is annealed, reactivation occurs. In other words, the dopant concentration of Mg in the surface of GaN is increased by removing Mg—H intermetal compounds, so that the effective carrier concentration in the surface of the p-type clad layer exceeds $10^{18}/cm^2$. As a result, a tunneling phenomenon occurs between the p-type clad layer and the ohmic contact layer containing nickel oxide and thus, the ohmic contact layer has a low specific contact resistance.

However, a TLED having a semi-transparent thin-film electrode formed of Ni/Au contains Au, which degrades transmittance. As a result, the TLED has a low luminous efficiency and thus, cannot be one of the next-generation light emitting devices that have a high capacity and a high luminance.

Also, an FCLED includes a reflective film and radiates light through a transparent substrate formed of sapphire in order to increase heat emission and luminous efficiency during the driving of the FCLED. However, the FCLED has a high resistance due to oxidation and poor adhesion of the reflective film.

To overcome the drawbacks of the TLEDs and FCLEDs, a structure in which a TCO excluding Au, for example, ITO, instead of a conventional Ni/Au layer is used as a p-type ohmic contact layer so as to obtain a high transmittance was disclosed in many papers (e.g., IEEE PTL, Y. C. Lin, et al. Vol. 14, 1668 and IEEE PTL, Shyi-Ming Pan, et al. Vol. 15, 646). In recent years, a paper (Semicond. Sci. Technol., C S Chang, etc. 18 (2003), L21) has presented a TLED that employs an ITO ohmic contact layer and has better output power than a TLED having a conventional Ni/Au film. However, although these ohmic contact layers can increase the output power of light emitting devices, they require relatively high operating voltages. Accordingly, since many problems still remain unsolved, the foregoing ohmic contact layers cannot be readily applied to light emitting devices that have a large area, a high capacity, and a high luminance.

In the meantime, LumiLeds Lighting (US) has reported that an LED having a high transmittance and excellent electrical characteristics was manufactured by combining oxidized thin Ni/Au (or Ni/Ag) and ITO (U.S. Pat. No. 6,287,947 by Michael J. Ludowise et al.). However, an ohmic-contact electrode forming process is very complicated, and because an ohmic electrode formed of transitional metals including Ni or oxides of elements of the group II of the Mendeleev Periodic Table has a high sheet resistance, it is difficult to embody a highly efficient light emitting device. Further, it is known that oxides of metals including Ni hardly have a high transmittance.

In summary, it is very difficult to obtain a transparent electrode including a good ohmic contact layer because of the following problems.

First, p-type GaN has a low hole concentration and thus, has a high sheet resistance of 104 $\Omega/cm^2$ or higher.

Second, since there is no material for the transparent electrode having a larger work function than the p-type GaN, high Schottky barrier is formed between the p-type GaN and the transparent electrode, thereby precluding efficient vertical hole injection.

Third, the electrical characteristics of most materials are inversely proportional to the optical characteristics thereof. Thus, a transparent electrode having a high transmittance generally has a high sheet resistance so that horizontal current spreading is remarkably degraded.

Fourth, while a TCO is being directly deposited on the p-type GaN, $Ga_2O_3$, which is an insulating material, is produced on the surface of the GaN, thus deteriorating the electrical characteristics of a light emitting device.

Finally, more heat is generated between the p-type GaN and the transparent electrode due to the above-described problems, so that the life span of the light emitting device is shortened and the operating reliability thereof is degraded.

SUMMARY OF THE INVENTION

The present invention provides a top-emitting GaN-based light emitting device, which includes an electrode having a high transmittance and a low sheet resistance, and a method of manufacturing the same.

According to an aspect of the present invention, there is provided a top-emitting N-based light emitting device which includes an active layer between an n-type clad layer and a p-type clad layer. The light emitting device includes a multi ohmic contact layer including one or more stacked structures, each including a modified metal layer and a transparent conductive thin film layer, and the stacked structures are repetitively stacked on the p-type clad layer. The modified metal layer is formed of an Ag-based material, for example.

The transparent conductive thin film layer may be formed of a combination of O and at least one selected from the group consisting of In, Sn, Zn, Ga, Cd, Mg, Be, Ag, Mo, V, Cu, Ir, Rh, Ru, W, Co, Ni, Mn, Al, and Ln (lanthanized series).

In another case, the transparent conductive thin film layer may be formed of TiN.

The modified metal layer may have a thickness of about 1 to 20 nm.

The transparent conductive thin film layer may have a thickness of about 10 to 1000 nm.

Also, a metal interposed layer may be additionally disposed between the modified metal layer and the transparent conductive thin film layer. The metal interposed layer may be formed of at least one selected from the group consisting of Pt, Ni, Au, Ru, Pd, Rh, Ir, Zn, Mg, Cr, Cu, Co, In, Sn, Ln, an alloy or solid solution thereof, and nitrides of transitional metals.

According to another aspect of the present invention, there is provided a method of manufacturing a top-emitting N-based light emitting device which includes an active layer between an n-type clad layer and a p-type clad layer. In this method, a multi ohmic contact layer is formed by repetitively stacking one or more stacked structures, each including a modified metal layer and a transparent conductive thin film layer, on the p-type clad layer of a light emitting structure including the n-type clad layer, the active layer, and the p-type clad layer that are sequentially stacked on a substrate. Thereafter, the multi ohmic contact layer is annealed. The modified metal layer is formed of Ag, for example.

The transparent conductive thin film layer may be formed of a TCO or TCN, which is added by at least one of metals of the Mendeleev periodic table, in order to improve the electrical characteristics thereof.

The annealing of the multi ohmic contact layer may be performed at a temperature between a room temperature and 800° C. for 10 seconds to 3 hours.

During the annealing, at least one of N, Ar, He, $O_2$, $H_2$, and air may be injected into a reactor in which the multi ohmic contact layer is loaded.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
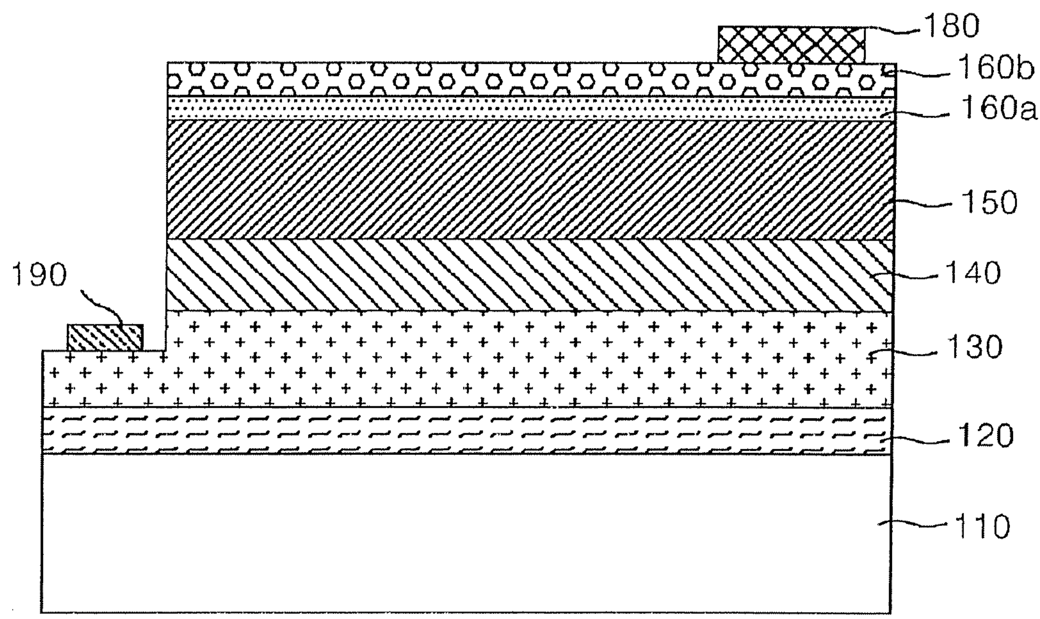
FIG. 1 is a cross-sectional view of a top-emitting light emitting device including a multi ohmic contact layer as a p-type electrode according to an embodiment of the present invention.

FIG. 1 is a cross-sectional view of a top-emitting light emitting device according to an embodiment of the present invention.

Referring to FIG. 1, the top-emitting light emitting device includes a substrate 110, a buffer layer 120, an n-type clad layer 130, an active layer 140, a p-type clad layer 150, and a multi ohmic contact layer 160, which are sequentially stacked. Reference numeral 180 denotes a p-type electrode pad, and 190 denotes an n-type electrode pad.

The multi ohmic contact layer 160 includes a modified metal layer **160*a* and a transparent conductive thin film layer 160*b***, which are sequentially stacked.

A stacked structure including the substrate 110, the buffer layer 120, the n-type clad layer 130, the active layer 140, and the p-type clad layer corresponds to a light emitting structure, and the multi ohmic contact layer 160 corresponds to a p-type electrode structure.

The substrate 110 may be formed of one selected from the group consisting of sapphire ($Al_2O_3$), silicon carbide (SiC), silicon (Si), and gallium arsenide (GaAs).

The buffer layer 120 may be optically formed.

Each of the buffer layer 120, the n-type clad layer 130, the active layer 140, and the p-type clad layer 150 is basically formed of a III-group N-based compound ($Al_xIn_yGa_zN$ ($0 \leqq x \leqq 1$, $0 \leqq y \leqq 1$, $0 \leqq z \leqq 1$, and $0 \leqq x+y+z \leqq 1$)), and each of the n- and p-type clad layers 130 and 150 is doped with a certain dopant.

Also, the active layer 140 may be a film having one of various known structures, for example, a single film or a multiple quantum well (MQW) film.

If a GaN-based compound is taken as an example, the buffer layer 120 may be formed of GaN, the n-type clad layer 130 may be formed of GaN doped with an n-type dopant, such as Si, Ge, Se, and Te, the active layer 140 may be formed of InGaN/GaN MQW or AlGaN/GaN MQW, and the p-type clad layer 150 may be formed of GaN doped with a p-type dopant, such as Mg, Zn, Ca, Sr, and Ba.

An n-type ohmic contact layer (not shown) may be interposed between the n-type clad layer 130 and the n-type electrode pad 190. The n-type ohmic contact layer may have various known structures, for example, a stacked structure of Ti and Al.

The p-type electrode pad 180 may have a stacked structure of Ni/Au or Ag/Au.

Each of the above-described films may be formed using a known deposition method, such as an e-beam evaporator, PVD, chemical vapor deposition (CVD), plasma laser deposition (PLD), a dual-type thermal evaporator, or sputtering.

The multi ohmic contact layer 160, which is the p-type electrode structure, includes the modified metal layer 160*a* formed on the p-type clad layer 150 and the transparent conductive thin film layer 160*b* formed on the modified metal layer 160*a*.

The modified metal layer 160*a* is formed of a material, which has a high electroconductivity, is easily decomposed into nano-phase grains due to annealing performed in an $O_2$ atmosphere at a temperature of 600° C. or lower, and is not easily oxidized. Considering the above-described conditions, the modified metal layer 160*a* may be formed of Ag, for example.

The modified metal layer 160*a* is preferably formed of only Ag. In another case, the modified metal layer 160*a* may be formed of an Ag-based alloy or solid solution.

The modified metal layer 160*a* forming the multi ohmic contact layer 160 may be formed to a thickness of about 1 to 20 nm such that it can be easily decomposed into nano-phase grains due to annealing.

The transparent conductive thin film layer 160*b* may be formed of one of TCO and TCN.

The TCO is a combination of O and at least one selected from the group consisting of In, Sn, Zn, Ga, Cd, Mg, Be, Ag, Mo, V, Cu, Ir, Rh, Ru, W, Co, Ni, Mn, Al, and Ln (lanthanized series).

If the transparent conductive thin film layer 160*b* is formed of TCO, the work function and sheet resistance of the TCO are generally considered above all.

If the transparent conductive thin film layer 160*b* is formed of a TCN, TiN, which has a low sheet resistance and a high transmittance, is generally preferred.

The transparent conductive thin film layer 160*b* can be formed of a TCO or TCN, which is added by at least one of metals of the Mendeleev periodic table, in order to improve the electrical characteristics thereof.

To obtain adequate electrical characteristics, an addition ratio of the added metal to the TCO or TCN may be in the range of 0.001 to 20 weight %.

Also, to obtain an adequate transmittance and electroconductivity, the transparent conductive thin film layer 160*b* may be formed to a thickness of about 10 to 1000 nm.

The multi ohmic contact layer 160 may be formed using one of an e-beam evaporator, a thermal evaporator, sputtering, and PLD.

Also, the multi ohmic contact layer 160 can be deposited at a temperature of about 20 to 1500° C. under a pressure of an atmospheric pressure to about $10^{-12}$ torr.

Also, the formation of the multi ohmic contact layer 160 may be followed by annealing.

The annealing is performed in vacuum or gaseous atmosphere at a temperature of about 100 to 800° C. for 10 seconds to 3 hours.

During the annealing, at least one of N, Ar, He, $O_2$, $H_2$, and air may be injected into a reactor.

Figure 2:
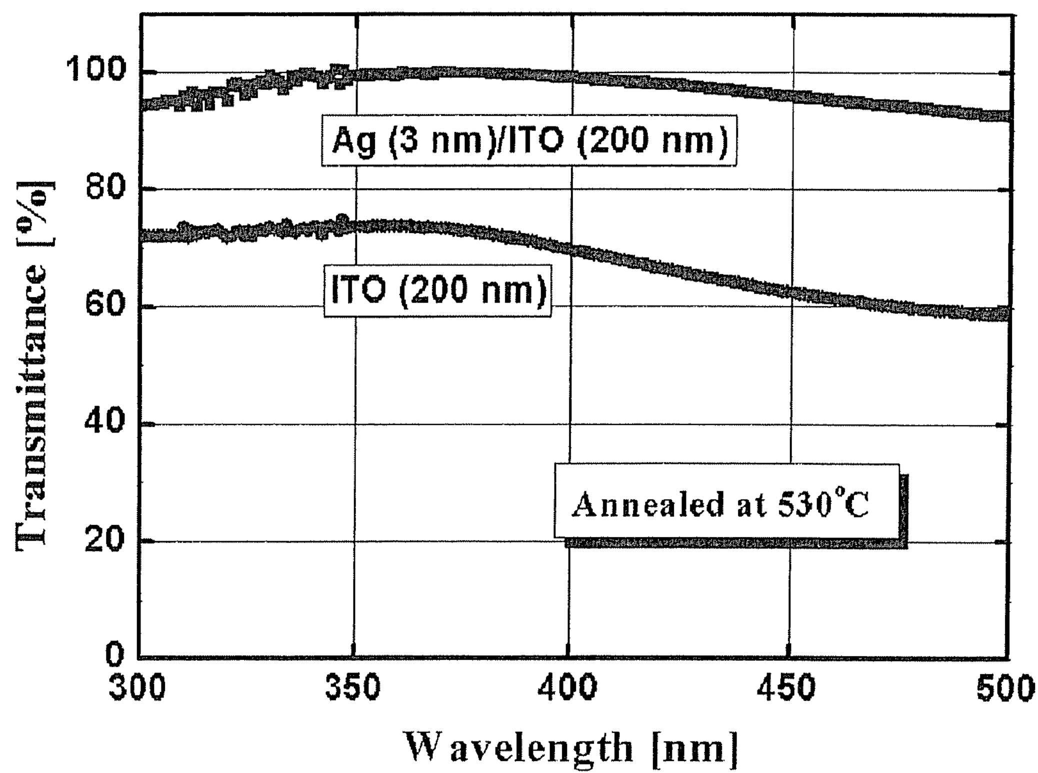
FIG. 2 is a graph of transmittance versus wavelength in light emitting devices using the multi ohmic contact layer shown in FIG. 1 and a single transparent electrode film, respectively.

FIG. 2 is a graph of transmittance versus wavelength in light emitting devices using the multi ohmic contact layer 160 as a p-type electrode shown in FIG. 1 and a single transparent electrode film, respectively. To form the multi ohmic contact layer 160, a modified metal layer 160*a* was formed on a p-type clad layer 150 using Ag to a thickness of 3 nm, a transparent conductive thin film layer 160*b* was stacked thereon using ITO to a thickness of about 200 nm, and the resultant structure was annealed at a temperature of 530° C. The single transparent electrode film was formed by stacking ITO on a p-type clad layer 150 to a thickness of about 200 nm and annealing the ITO film at a temperature of 530° C.

As can be seen from FIG. 2, the multi ohmic contact layer 160 has a higher transmittance than the single electrode film formed of ITO.

Figure 3:
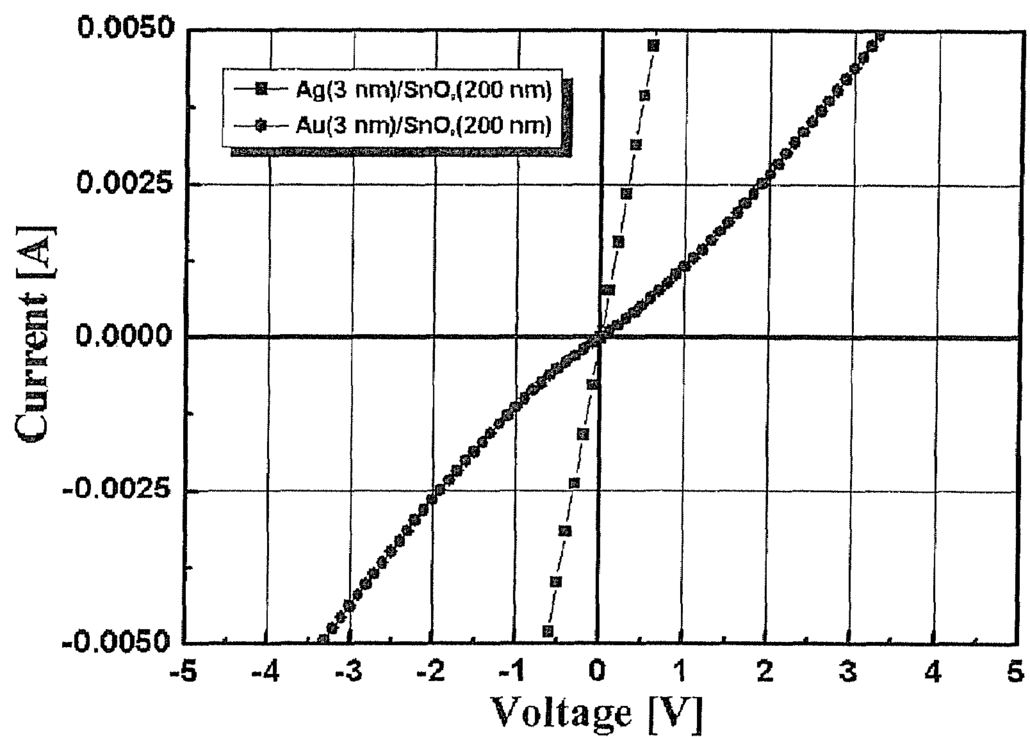
FIG. 3 is a graph of current versus voltage in light emitting devices using the multi ohmic contact layer shown in FIG. 1 and a film formed of Au instead of Ag, respectively.

FIG. 3 is a graph of current versus voltage in light emitting devices using the multi ohmic contact layer 160 shown in FIG. 1 and a film formed of Au instead of Ag, respectively. To form the multi ohmic contact layer 160, a modified metal layer 160*a* was formed on a p-type clad layer 150 using Ag to a thickness of 3 nm, a transparent conductive thin film layer 160*b* was stacked thereon using $SnO_2$ to a thickness of 200 nm, and the resultant structure was annealed at a temperature of 530° C. Also, to compare with the multi ohmic contact layer 160, an Au film was stacked on a p-type clad layer 150 to a thickness of 3 nm, and a transparent conductive thin film layer was stacked thereon using $SnO_2$ to a thickness of 200 nm, and the resultant structure was annealed at the same temperature, i.e., 530° C.

It can be observed from FIG. 3 that when the modified meal film 160*a* was formed of Ag, the electrical characteristic was even better than when the Au film was used.

As can be seen from FIGS. 2 and 3, when the multi ohmic contact layer 160 was formed by sequentially stacking the Ag modified metal layer 160*a* and the transparent conductive thin film layer 160*b* and annealing the stacked films, a lot of advantages can be obtained. Specifically, gallide is formed between the p-type clad layer 150 and the modified metal layer 160*a* so that effective surface hole concentration increases, and the generation of $Ga_2O_3$ is suppressed so that the width of Schottky barrier is reduced. Also, a tunneling phenomenon occurs to facilitate formation of ohmic contact.

Further, even if the multi ohmic contact layer 160 is annealed at a low temperature of 600° C. or lower, a high transmittance can be maintained. In addition, the multi ohmic contact layer 160 has a low sheet resistance of about 10 Ω/cm$^2$ or lower.

Meanwhile, it is obvious that the multi ohmic contact layer 160 can be formed by repetitively stacking one or more stacked structures, each including the modified metal layer 160*a* and the transparent conductive thin film layer 160*b*.

Figure 4:
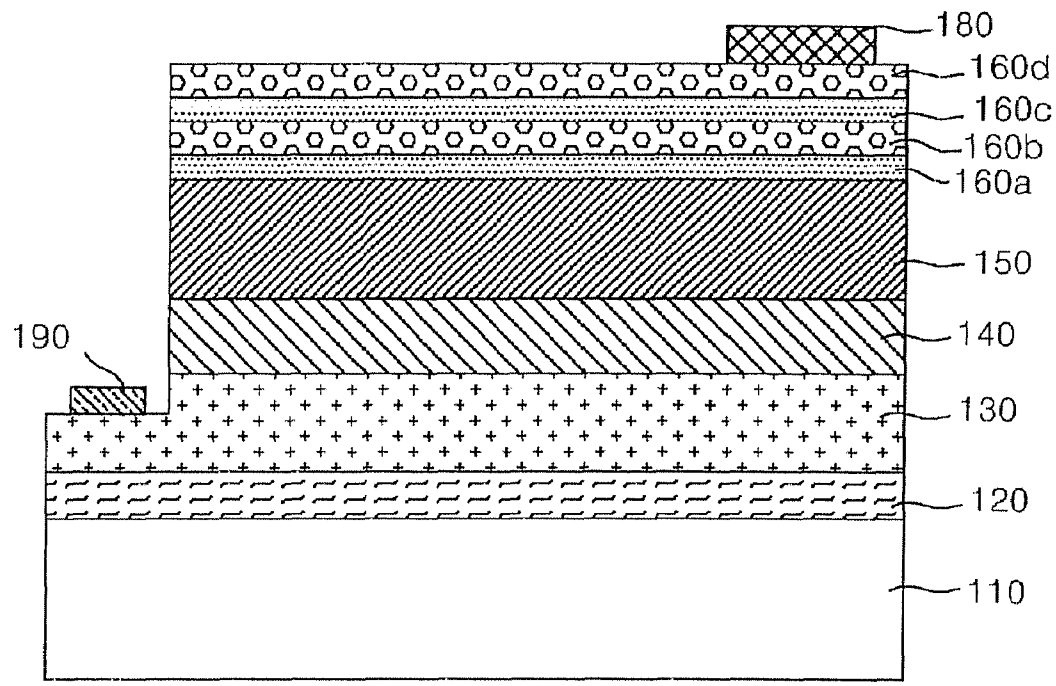
FIG. 4 is a cross-sectional view of a top-emitting light emitting device including a multi ohmic contact layer according to another embodiment of the present invention.

A multi ohmic contact layer according to another embodiment of the present invention, in which two or more stacked structures, each including a modified metal layer and a transparent conductive thin film layer, are repetitively stacked, is illustrated in FIG. 4. In FIG. 4, the same reference numerals are used to denote the same elements as in FIG. 1.

Referring to FIG. 4, a multi ohmic contact layer 160 includes a first modified metal layer 160*a*, a first transparent conductive thin film layer 160*b*, a second modified metal layer 160*c*, and a second transparent conductive thin film layer 160*d*, which are sequentially stacked.

Each of the first and second modified metal layers 160*a* and 160*c* is formed of Ag or an Ag-based alloy or solid solution to a thickness of about 1 to 20 nm, for example. Each of the first and second transparent conductive thin film layers 160*b* and 160*d* is formed of the above-described materials to a thickness of about 10 to 1000 nm, for example.

The multi ohmic contact layer 160 as a p-type electrode structure is deposited on a light emitting structure including a substrate 110, a buffer layer 120, an n-type clad layer 130, an active layer 140, a p-type clad layer 150, which are sequentially stacked. In this case, the multi ohmic contact layer 160 is deposited on the light emitting structure using the method as described with reference to FIG. 1. Thereafter, the resultant structure is annealed, thereby manufacturing a light emitting device shown in FIG. 4.

As a result of the annealing process, the light emitting device can have improved transmittance and current-voltage (I-V) characteristic.

Figure 5:
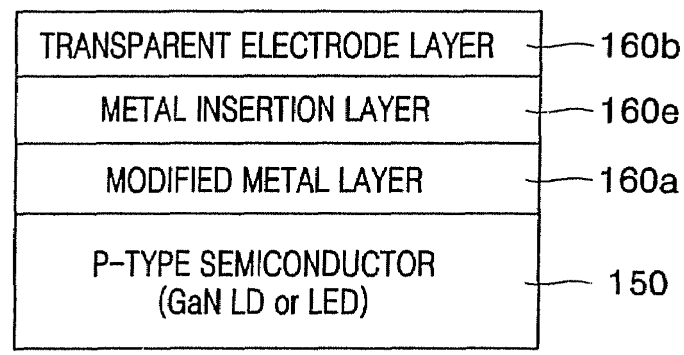
FIG. 5 is a cross-sectional view of a top-emitting light emitting device including a multi ohmic contact layer according to yet another embodiment of the present invention.

Meanwhile, FIG. 5 is a cross-sectional view of a top-emitting light emitting device including a multi ohmic contact layer according to yet another embodiment of the present invention.

Referring to FIG. 5, the multi ohmic contact layer as a p-type electrode additionally includes a metal interposed layer 160*e* between a modified metal layer 160*a* and a transparent conductive thin film layer 160*b*. The metal interposed layer 160*e* is formed as a second modified metal layer that performs substantially the same function as the modified metal layer 160*a*.

The metal interposed layer 160*e* may be formed of at least one selected from the group consisting of Pt, Ni, Au, Ru, Pd, Rh, Ir, Zn, Mg, Cr, Cu, Co, In, Sn, Ln, an alloy or solid solution thereof, and nitrides of transitional metals.

Figure 6A:
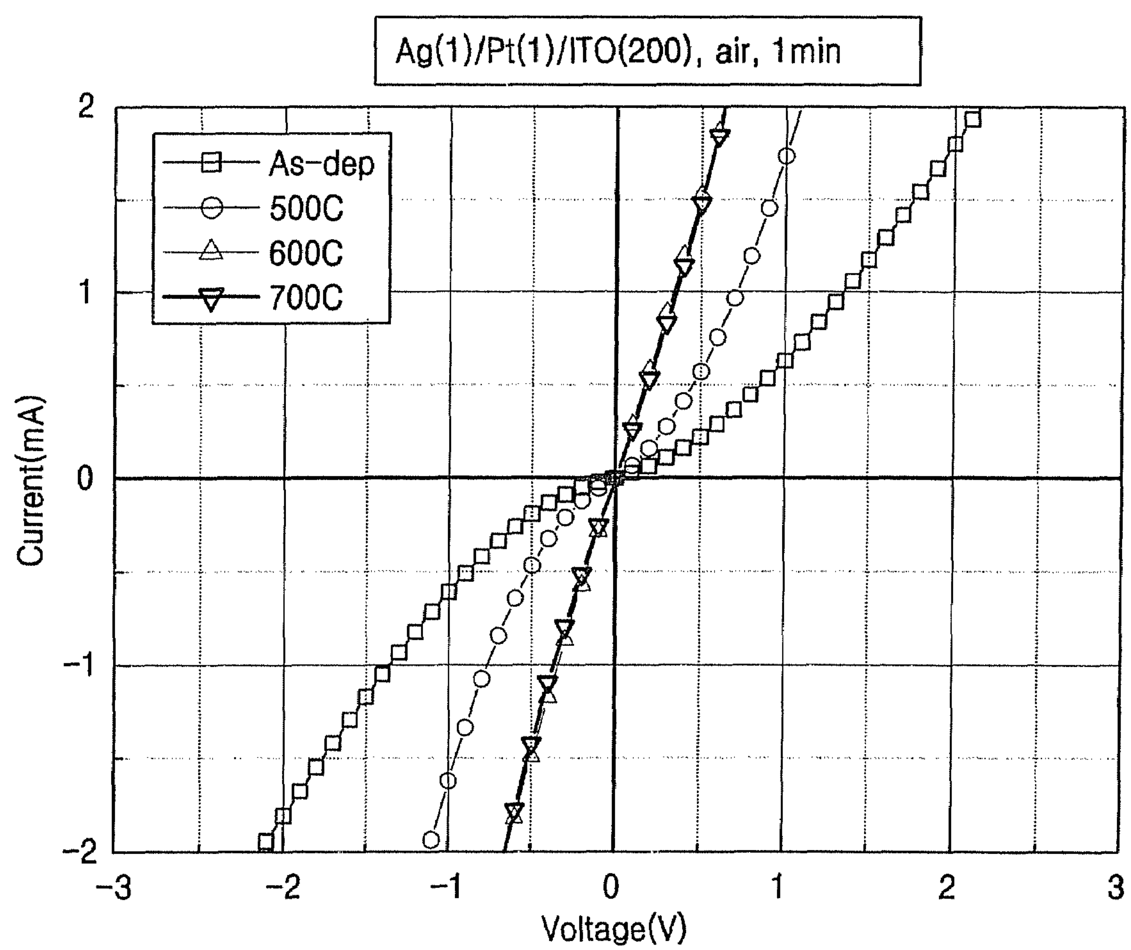
FIG. 6A is a graph of current versus voltage in a light emitting device using the multi ohmic contact layer shown in FIG. 5.

FIG. 6A is a graph of current versus voltage in a light emitting device using the multi ohmic contact layer shown in FIG. 5. To form the multi ohmic contact layer, a modified metal layer 160*a* was formed of Ag to a thickness of 1 nm, a metal interposed layer 160*e* was formed of Pt to a thickness of 1 nm, and a transparent conductive thin film layer 160*b* was formed of ITO to a thickness of 200 nm. Thereafter, the I-V characteristic of the light emitting device using the multi ohmic contact layer was respectively measured as-dep (■) and after an annealing process was performed in an air atmosphere at 500° C. (●), 600° C. (▲), and 700° C. (▼). It can be observed from FIG. 6 that when the multi ohmic contact layer was annealed at 600° C. or higher, it exhibited a very excellent electrical characteristic.

Figure 6B:
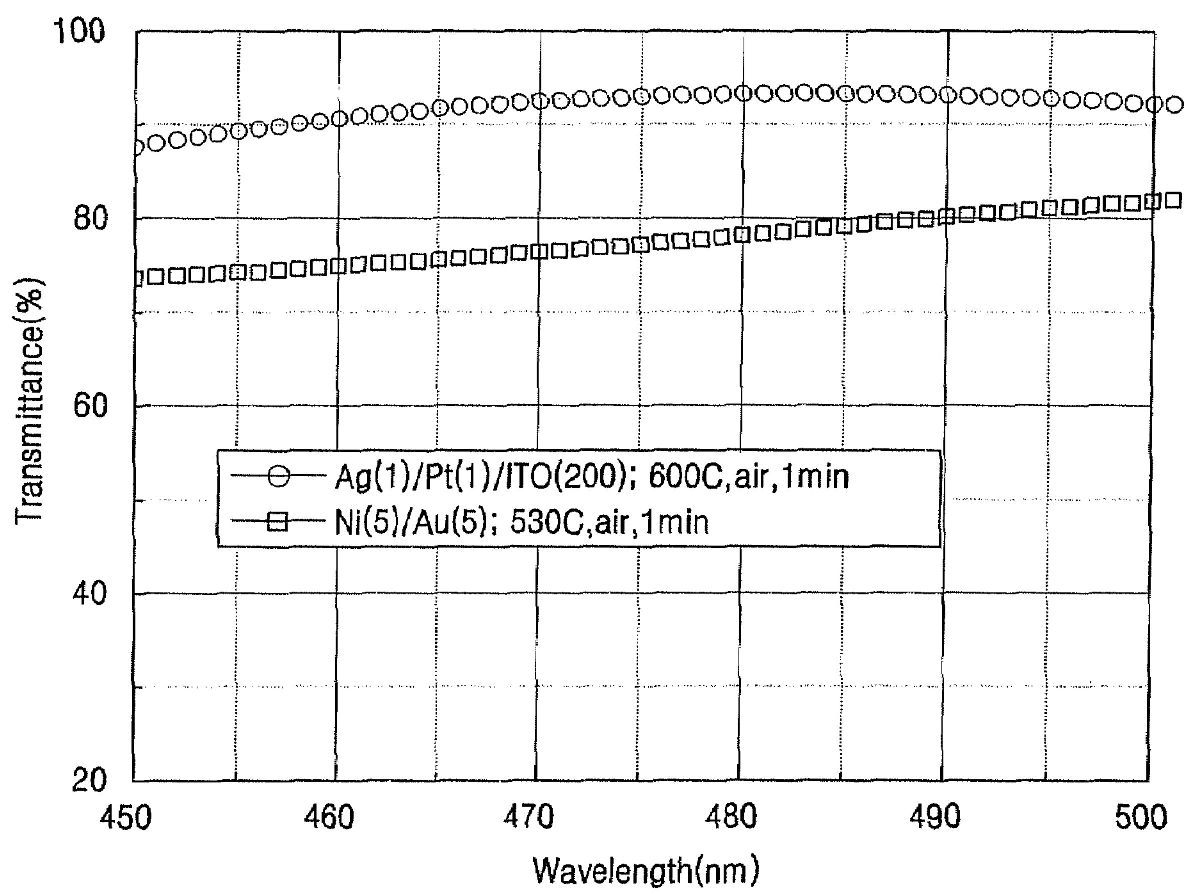
FIG. 6B is a graph of transmittance versus wavelength in light emitting devices using the multi ohmic contact layer shown in FIG. 5 and a conventional electrode, respectively.

FIG. 6B is a graph of transmittance versus wavelength in light emitting devices using the multi ohmic contact layer shown in FIG. 5 and a conventional electrode, respectively. As described with reference to FIG. 6A, to form the multi ohmic contact layer as a p-type electrode, a modified metal layer 160*a* was formed of Ag to a thickness of 1 nm, a metal interposed layer 160*e* was formed of Pt to a thickness of 1 nm, and a transparent conductive thin film layer 160*b* was formed of ITO to a thickness of 200 nm. Thereafter, the resultant structure was annealed in an air atmosphere at about 600° C. for 1 minute. To compare with the p-type electrode, the conventional electrode was formed by stacking a 5-nm Ni film and a 5-nm Au film and annealing the stacked films in an air atmosphere at 530° C. for 1 minute. It can be observed from FIG. 6B that when the conventional electrode was used, transmittance was about 73 to 81% in the wavelength range of 450 to 500 nm. However, when the p-type electrode according to the present invention was used, transmittance exceeded 90% in the same wavelength range.

As explained thus far, in a top-emitting N-based light emitting device of the present invention, an ohmic contact characteristic between an ohmic contact layer and a p-type clad layer is improved. Thus, the light emitting device can have not only an excellent I-V characteristic but also high luminous efficiency.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a top-emitting N-based light emitting device comprising:

providing a substrate;

forming a light emitting structure by sequentially stacking an n-type clad layer, an active layer, and a p-type clad layer on the substrate;

forming a multi ohmic contact layer by repetitively stacking one or more stacked structures on the p-type clad layer, each of the stacked structures including a modified metal layer, a transparent conductive thin film layer and a metal interposed layer disposed between the modified metal layer and the transparent conductive thin film layer; and annealing the multi ohmic contact layer, wherein the modified metal layer is formed of Ag.

2. The method of claim 1, wherein the transparent conductive thin film layer is formed of one selected from the group consisting of transparent conductive oxide (TCO) and transparent conductive nitride (TCN).

3. The method of claim 2, wherein the transparent conductive thin film layer is formed of TiN.

4. The method of claim 2, wherein the TCO is formed of a combination of O and at least one selected from the group consisting of In, Sn, Zn, Ga, Cd, Mg, Be, Ag, Mo, V, Cu, Ir, Rh, Ru, W, Co, Ni, Mn, Al, and Ln.

5. The method of claim 1, wherein the modified metal layer is formed to a thickness of about 1 to 20 nm.

6. The method of claim 1, wherein the transparent conductive thin film layer is formed to a thickness of about 10 to 1000 nm.

7. The method of claim 1, wherein the metal interposed layer is formed of at least one selected from the group consisting of Pt, Ni, Au, Ru, Pd, Rh, Ir, Zn, Mg, Cr, Cu, Co, In, Sn, Ln, and nitrides of transitional metals.

8. A method of manufacturing a top-emitting N-based light emitting device comprising:

providing a substrate;

forming a light emitting structure by sequentially stacking an n-type clad layer, an active layer, and a p-type clad layer on the substrate;

forming a multi ohmic contact layer by stacking a plurality of repeatedly stacked structures on the p-type clad layer, each of the repeatedly stacked structures including a modified metal layer and a transparent conductive thin film layer;

annealing the multi ohmic contact layer; and forming a p-type electrode on the multi ohmic contact layer wherein the modified metal layer is formed of Ag.

* * * * *